United States Patent
Chen et al.

(10) Patent No.: US 10,717,806 B2
(45) Date of Patent: Jul. 21, 2020

(54) PACKAGING MATERIAL AND FILM

(71) Applicant: INDUSTRIAL TECHNOLOGY RESEARCH INSTITUTE, Hsinchu (TW)

(72) Inventors: Wen-Bin Chen, Tainan (TW); Kai-Chi Chen, Tsautuen Jen (TW); Shu-Chen Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 16/175,283

(22) Filed: Oct. 30, 2018

(65) Prior Publication Data

US 2019/0127513 A1    May 2, 2019

(30) Foreign Application Priority Data

Nov. 1, 2017    (TW) .............................. 106137753 A

(51) Int. Cl.
*C08G 59/30*    (2006.01)
*C08G 59/24*    (2006.01)
(Continued)

(52) U.S. Cl.
CPC ......... *C08G 59/306* (2013.01); *C08G 59/245* (2013.01); *C08K 3/22* (2013.01);
(Continued)

(58) Field of Classification Search
CPC .. C08G 59/245; C08G 59/306; C08G 77/045; C08G 77/26; C08G 77/14; C08G 77/12; C08K 3/22; C08K 3/26; C08K 3/36; C08K 5/5419; C08K 2201/003; C08K 2003/2227; C08K 2003/2241; C08K 2003/2296; C08K 2003/265; C08L 83/06; C08L 83/08;
(Continued)

(56) References Cited

U.S. PATENT DOCUMENTS 8,721,919 B2   5/2014  Huang et al.
8,802,776 B2   8/2014  Koyama et al.
(Continued)

FOREIGN PATENT DOCUMENTS

CN    104312471 A    1/2015
CN    104830024 A    8/2015
(Continued)

OTHER PUBLICATIONS

Nakamura et al., JP 10-237270 A, machine translation in English, Sep. 8, 1998 (Year: 1998).*
(Continued)

*Primary Examiner* — David T Karst
(74) *Attorney, Agent, or Firm* — Birch, Stewart, Kolasch & Birch, LLP

(57) ABSTRACT

A packaging material is provided. The packaging material includes (a) epoxy silsesquioxane, (b) epoxy resin, and (c) siloxane-imide-containing benzoxazine compound. (a) Epoxy silsesquioxane and (b) epoxy resin have a weight ratio of 0.3:1 to 10:1. The total weight of (a) epoxy silsesquioxane and (b) epoxy resin and the weight of (c) siloxane-imide-containing benzoxazine compound have a ratio of 100:20 to 100:150.

10 Claims, 3 Drawing Sheets

Silsesquioxane precurser allyl glycidyl ether

DDSQ epoxy-1

(51) Int. Cl.
*C08K 5/5419* (2006.01)
*C08K 3/36* (2006.01)
*C08K 3/22* (2006.01)
*H01L 23/31* (2006.01)
*C08K 3/26* (2006.01)
*H01L 23/29* (2006.01)
*C08L 83/06* (2006.01)
*C08L 83/08* (2006.01)
*C08G 77/04* (2006.01)
*C08G 77/26* (2006.01)
*C08G 77/14* (2006.01)
*C08G 77/12* (2006.01)
*C08L 63/00* (2006.01)
*C08L 83/00* (2006.01)

(52) U.S. Cl.
CPC ............... *C08K 3/26* (2013.01); *C08K 3/36* (2013.01); *C08K 5/5419* (2013.01); *C08L 83/06* (2013.01); *C08L 83/08* (2013.01); *H01L 23/296* (2013.01); *H01L 23/3114* (2013.01); *C08G 77/045* (2013.01); *C08G 77/12* (2013.01); *C08G 77/14* (2013.01); *C08G 77/26* (2013.01); *C08K 2003/2227* (2013.01); *C08K 2003/2241* (2013.01); *C08K 2003/2296* (2013.01); *C08K 2003/265* (2013.01); *C08K 2201/003* (2013.01)

(58) Field of Classification Search
CPC ........ C08L 63/00; C08L 83/00; H01L 23/296; H01L 23/3114
USPC ............................................. 523/435
See application file for complete search history.

(56) References Cited

U.S. PATENT DOCUMENTS

| | | | |
|---|---|---|---|
| 9,296,928 B2 | 3/2016 | Shin | |
| 9,540,488 B1 | 1/2017 | Lin et al. | |
| 9,617,411 B2 | 4/2017 | Chan et al. | |
| 2013/0037310 A1* | 2/2013 | Kimura | C08J 5/24 174/251 |
| 2015/0041846 A1* | 2/2015 | Suzuki | C08G 59/226 257/100 |
| 2016/0075871 A1* | 3/2016 | Morita | H01L 21/6836 438/118 |

FOREIGN PATENT DOCUMENTS

| | | | | |
|---|---|---|---|---|
| CN | 103665863 B | 1/2016 | | |
| CN | 103483588 B | 3/2016 | | |
| CN | 106590498 A | 4/2017 | | |
| CN | 106883613 A | 6/2017 | | |
| EP | 2883896 A1 * | 6/2015 | ............ | C08L 83/04 |
| JP | 10237270 A * | 9/1998 | ............ | C08L 63/00 |
| JP | 2016-141739 A | 8/2016 | | |
| TW | 201120171 A1 | 6/2011 | | |
| TW | I499608 B | 9/2015 | | |
| TW | I516544 B | 1/2016 | | |
| TW | I557183 B | 11/2016 | | |
| TW | I565732 B | 1/2017 | | |
| WO | 2016/125537 A1 | 8/2016 | | |

OTHER PUBLICATIONS

Chen et al., "Synthesis and Characterization of a Novel Siloxane-imide-containing Polybenzoxazine," Polym Int, vol. 60, 2011 (Published online Nov. 10, 2010), pp. 436-442.

Chen et al., "Synthesis and Performance Enhancement of Novel Polybenzoxazines with Low Surface Free Energy," Polym Int, vol. 60, 2011 (Published online Mar. 2, 2011), pp. 1089-1096.

Chen, "Preparation of Novel Siloxane-Imide-Containing Polybenzoxazines and Characterization of Their High Performance Thermosets," Doctoral Thesis, Hsinchu, Taiwan, Republic of China, Jan. 2011, pp. 27-30, 89-107 (25 total pages).

Honda et al., "NCF for Wafer Lamination Process in Higher Density Electronic Packages," 2010 Electronic Components and Technology Conference, 2010, pp. 1853-1860.

Mohamed et al., "Polybenzoxazine/Polyhedral Oligomeric Silsesquioxane (POSS) Nanocomposites," Polymers, vol. 8, No. 225, 2016 (Published: Jun. 7, 2016), pp. 1-20.

Nonaka et al., "Development of Wafer Level NCF (Non Conductive Film)," 2008 Electronic Components and Technology Conference, 2008, pp. 1550-1555.

Taiwanese Office Action and Search Report, dated Jul. 31, 2018, for Taiwanese Application No. 106137753.

* cited by examiner

PACKAGING MATERIAL AND FILM

CROSS REFERENCE TO RELATED APPLICATIONS

The present application is based on, and claims priority from, Taiwan Application Serial Number 106137753, filed on Nov. 1, 2017, the disclosure of which is hereby incorporated by reference herein in its entirety.

TECHNICAL FIELD

The technical field relates to a packaging material.

BACKGROUND

In recent years, new electronic devices to meet the market trends that have tended to be lighter in weight, thinner, shorter, smaller, and better performing than previous generations. Packages with small size are critical to the packaging industry. The wafer level chip scale package (WLCSP) is leading a trend for use in portable computers, mobile devices (e.g. tablet computer and the like), information and communications technology (ICT) products, automobiles, and wearable products. The 3D IC package has been developed gradually in the semiconductor industry due to marketing and the requirements on product functionality. The conventional flip chip reflux bonding has been replaced with hot-pressing bonding, in which the technique of hot pressing a non-conductive paste also developed quickly in recent years.

The properties required of a suitable thin film packaging material for the WLCSP include excellent adhesion between a B-stage film and the chip, transparency of the B-stage film for alignment, and low stress. In addition, the B-stage film that adheres to the wafer may sustain cuts. The epoxy resin, which used widely in regular semiconductor device packaging and printed circuit board manufacturing, has characteristics of processability, high thermal resistance, and high humidity resistance, but cannot satisfy the high reliability requirement in semiconductor device packaging. Accordingly, a packaging material with properties suitable for the WLCSP is called for.

SUMMARY

One embodiment of the disclosure provides a packaging material, including: (a) epoxy silsesquioxane; (b) epoxy resin; and (c) siloxane-imide-containing benzoxazine compound, wherein (a) epoxy silsesquioxane and (b) epoxy resin have a weight ratio of 0.3:1 to 10:1; wherein the total weight of (a) epoxy silsesquioxane and (b) epoxy resin and the weight of (c) siloxane-imide-containing benzoxazine compound have a ratio of 100:20 to 100:150.

One embodiment of the disclosure provides a film being formed by coating and baking the packaging material.

A detailed description is given in the following embodiments.

BRIEF DESCRIPTION OF THE DRAWINGS

The disclosure can be more fully understood by reading the subsequent detailed description and examples with references made to the accompanying drawings, wherein.

DETAILED DESCRIPTION

Figure 1:
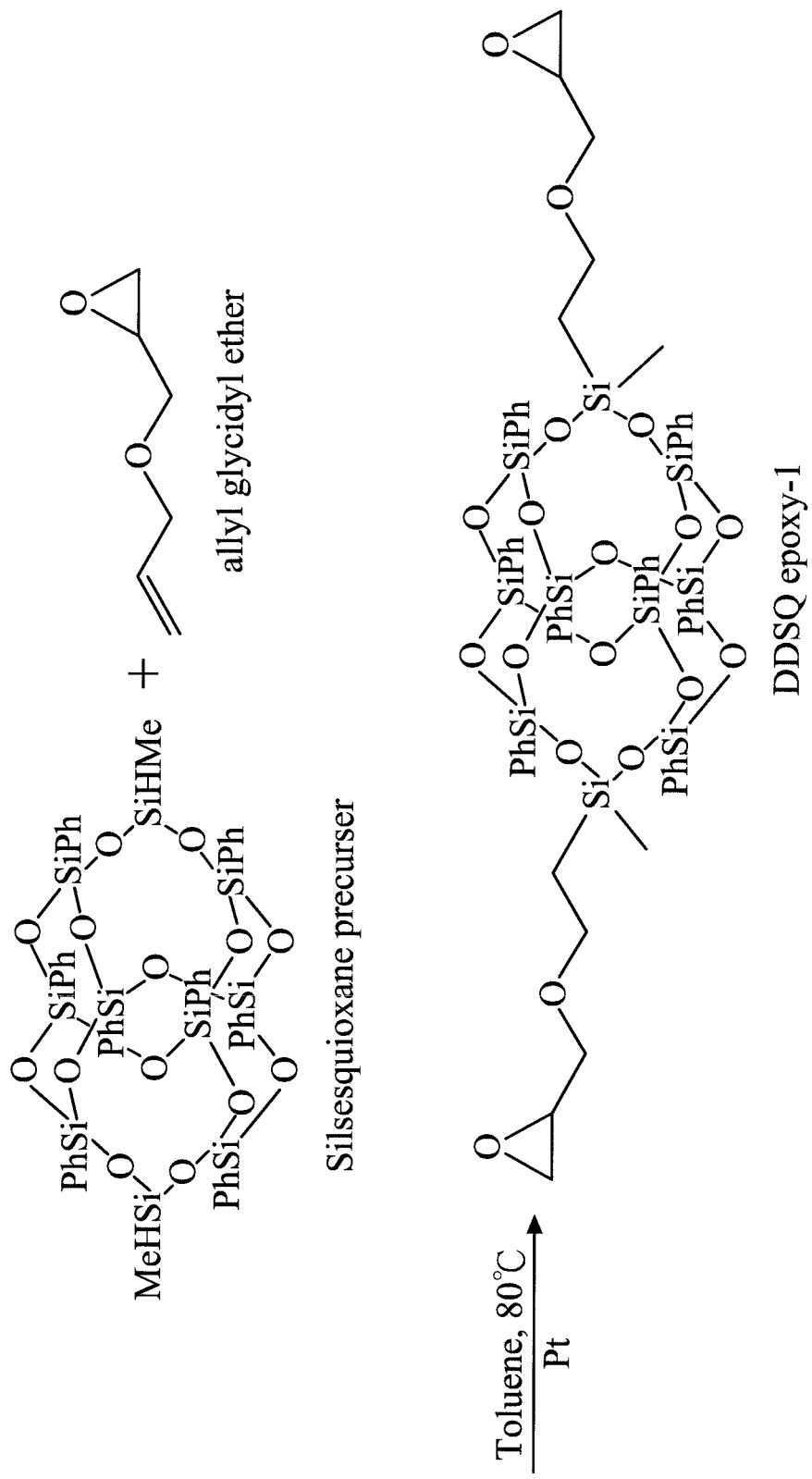
FIGS. 1 to 3 are chemical reactions in some embodiments of the disclosure.

In the following detailed description, for purposes of explanation, numerous specific details are set forth in order to provide a thorough understanding of the disclosed embodiments. It will be apparent, however, that one or more embodiments may be practiced without these specific details.

In one embodiment of the disclosure, the packaging material may include (a) epoxy silsesquioxane; (b) epoxy resin; and (c) siloxane-imide-containing benzoxazine compound. In one embodiment, (a) epoxy silsesquioxane has a chemical structure as shown in Formula 1 or Formula 2:

  (Formula 1)

  (Formula 2)

wherein each of $R^1$ and $R^3$ can be independently $C_1$-$C_{10}$ alkyl group or aromatic group; each of $R^2$ and $R^4$ can be independently epoxy cyclohexylethyl group or epoxy propyl ether allyl group; n1+n2 can be an integer of 4 to 12, and n2 can be 2, 4, or 6; and n3+n4 can be an integer of 4 to 12, and n4 can be 2, 3, 4, 6, 8, 10, or 12. (a) Epoxy silsesquioxane is a composite material containing terminal epoxy resin group, e.g. a molecular grade organic/inorganic hybrid resin material, which is formed by modifying the terminal site of the silsesquioxane. Therefore, the epoxy silsesquioxane and other compositions can be blended to achieve molecular grade dispersion. Not only is the compatibility of the compositions in the packaging material increased, the inorganic nano particles can also be dispersed well in the polymer material without aggregation. Moreover, the properties of the inorganic materials can be introduced into the polymer material to enhance the processability, toughness, size stability, and mechanical strength of the composite material. (a) Epoxy silsesquioxane has low stress to increase the toughness of the packaging material. (a) Epoxy silsesquioxane may have a weight average molecular weight (Mw) of 600 to 1600. (a) Epoxy silsesquioxane with too low a Mw cannot achieve the properties of the molecular grade organic/inorganic hybrid resin material, e.g. high toughness, size stability, mechanical strength, and the like. (a) Epoxy silsesquioxane with too high a Mw may lower the processability of the packaging material.

In one embodiment, (b) epoxy resin may include bisphenol A epoxy resin, bisphenol F epoxy resin, bisphenol S epoxy resin, polyacrylic epoxy resin, cycloaliphatic epoxy resin, glycerine epoxy resin, phenolic epoxy resin, phenylene oxide epoxy resin, or a combination thereof. (b) Epoxy resin may have an epoxy equivalent weight (EEW) of 150 to 2000. (b) Epoxy resin having too low an EEW results in the packaging material having poor mechanical properties or film formability. (b) Epoxy resin with too high an EEW may lower the processability of the packaging material. In one embodiment, (b) epoxy resin may include at least one or at least two epoxy resins of different EEW. In one embodiment, (a) epoxy silsesquioxane and (b) epoxy resin have a weight ratio of 0.3:1 to 10:1, such as 0.5:1 to 9:1. Too little (a) epoxy silsesquioxane cannot achieve molecular grade organic/inorganic hybrid resin properties, e.g. high size stability and mechanical strength. Too much (a) epoxy silsesquioxane results in an overly brittle packaging material, which is not suitable for application in the wafer level packaging process.

In one embodiment, (c) siloxane-imide-containing benzoxazine compound may have the chemical structure shown in Formula 3:

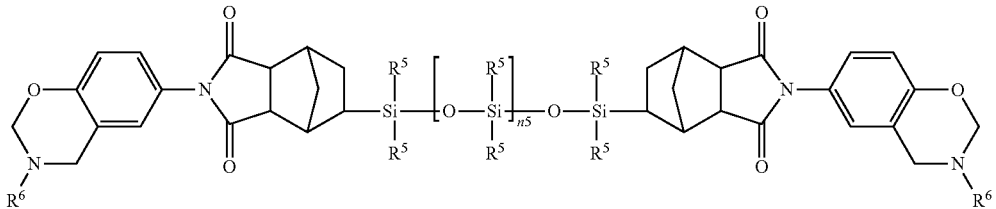

Formula 3 wherein each of $R^5$ can be independently $C_{1-10}$ alkyl group or aromatic group; each of $R^6$ can be independently $C_{1-10}$ alkyl group of aromatic group; and n5 can be 1 to 18. The middle segment of (c) siloxane-imide-containing benzoxazine compound is a linear siloxane structure, which may be combined with the imide group and terminal benzoxazine group to simultaneously achieve the softness, high glass transfer temperature (Tg), and thermal resistance of (c) siloxane-imide-containing benzoxazine compound. (c) Siloxane-imide-containing benzoxazine compound may have a weigh average molecular weight (Mw) of 600 to 1600. (c) Siloxane-imide-containing benzoxazine compound having too low a Mw results in an overly brittle packaging material, which is not suitable for the wafer level packaging process and the cutting process. (c) Siloxane-imide-containing benzoxazine compound having too high a Mw results in poor size stability of the packaging material (e.g. the Tg is too high), which may negatively affect the back-end package reliability. In one embodiment, the total weight of (a) epoxy silsesquioxane and (b) epoxy resin and the weight of (c) siloxane-imide-containing benzoxazine compound have a ratio of 100:20 to 100:150, such as 100:30 to 100:120. A packaging material with too little (c) siloxane-imide-containing benzoxazine compound has a poor film formability at B-stage. A packaging material with too much (c) siloxane-imide-containing benzoxazine compound has a lower transparency and alignment ability at B-stage, and is not beneficial in the back-end cutting process of the wafer level package.

In one embodiment, the packaging material may further include (d) amine curing agent, which may further help to prepare the film of the packaging material in the semi-crosslinking stage (B-stage). (d) Amine curing agent may have an asymmetrical structure. In other words, two terminals of (d) amine curing agent have different reactive functional groups. For example, one terminal of (d) amine curing agent is amino group, and another terminal of (d) amine curing agent is sulfone group, phenyl group, or imide group. One terminal functional group has a faster reaction rate, which may bond with the ring-opened epoxy resin at B-stage. When the film is baked to achieve the full-crosslinking stage (C-stage), the other terminal functional group with a slower reaction rate may further react to form the crosslinking structure. In particular, the amine curing agent can be sulfanilamide, toluene diamine, or a combination thereof. In one embodiment, the total weight of (a) epoxy silsesquioxane and (b) epoxy resin and the weight of (d) amine curing agent have a ratio of 100:1 to 100:2.5. Too much (d) amine curing agent may negatively affect the storage stability of the B-stage film.

In one embodiment, the packaging material may further include (e) inorganic powder to increase the mechanical strength of the packaging material and decrease the coefficient of the thermal expansion (CTE) of the packaging material. The inorganic powder may include $SiO_2$, $ZnO_2$, $Al_2O_3$, $CaCO_3$, or a combination thereof. The inorganic powder may have a diameter of 0.1 μm to 1 μm. (e) Inorganic powder that is too small is difficult to disperse due to easy aggregation. (e) Inorganic powder that is too large can easily result in a poor package quality, such as the contact resistance being too high when hot pressing the packaging material to bond the contact. In one embodiment, the total weight of (a) epoxy silsesquioxane and (b) epoxy resin and the weight of (e) inorganic powder have a ratio of 100:30 to 100:60. Too much (e) inorganic powder easily results in an overly brittle packaging material, lowers the transparency and alignment ability, and causes poor package quality (e.g. the contact resistance is too high when hot pressing the packaging material to bond the contact).

In one embodiment, the packaging material may further include (f) toughness enhancer to increase the toughness and film formability of the packaging material. (0 toughness enhancer can be a rubber material such as butadiene acrylonitrile rubber, carboxyl terminated butadiene acrylonitrile rubber, polysulfide rubber, epoxy terminated butadiene acrylonitrile rubber, or a combination thereof. In one embodiment, the total weight of (a) epoxy silsesquioxane and (b) epoxy resin and the weight of (f) toughness enhancer have a ratio of 100:12 to 100:25. Too much (f) toughness enhancer may greatly reduce the glass transfer temperature of the packaging material, and greatly increase the CTE of the packaging material, which is not beneficial to the back-end package reliability.

In one embodiment, the packaging material may further include (g) reaction promoter to lower the onset reaction temperature and enhance the reaction rate. (g) Reaction promoter may include imidazole compound, such as 2-methyl imidazole, 2-ethyl-4-methylimidazole, or a combination thereof. In one embodiment, the total weight of (a) epoxy silsesquioxane and (b) epoxy resin and the weight of (g) reaction promoter have a ratio of 100:7 to 100:12. Too much (g) reaction promoter may negatively affect the storage stability of the B-stage film.

In one embodiment, the packaging material may further include (h) soldering agent to assist removing the metal oxide film on the contact surface when hot pressing the packaging material to bond the contact, thereby improving the connection quality of the contact. The soldering agent may include organic acid compound, quinoline compound, or a combination thereof. The organic acid compound can be abietic acid, adipic acid, ascorbic acid, acrylic acid, citric acid, 2-furoic acid, malic acid, polyacrylic acid, 2,2-bishydroxymethylpentanoic acid, or 2-(methacryloyloxy) ethyl succinate. The quinoline compound can be quinoline or 8-hydroxyquinoline. In one embodiment, the total weight of (a) epoxy silsesquioxane and (b) epoxy resin and the weight of (h) soldering agent have a ratio of 100:4 to 100:7. Too much (h) soldering agent easily lower the glass transfer temperature and the crosslinking density of the packaging material.

In one embodiment, the packaging material may further include (i) surfactant to assist the film formation during coating the packaging material, and eliminate the bubbles on the film surface. The surfactant can be fluorine-based surfactant, silane-based surfactant, or a combination thereof. The fluorine-based surfactant can be fluorine-based polymer surfactant. The silane-based surfactant can be fluorine-containing silane, long carbon chain silane, and the like. In one embodiment, the total weight of (a) epoxy silsesquioxane and (b) epoxy resin and the weight of (i) surfactant have a ratio of 100:0.5 to 100:1. Too much (i) surfactant may easily degrade the properties of the packaging material.

In one embodiment, the compositions of the packaging material can be mixed, coated, and then baked to obtain a film. The film may have a thickness of 15 μm to 50 μm. In some embodiments, a solvent can be added to the packaging material, which may help to evenly mix the compositions of the packaging material. The solvent is not specifically limited, which can be organic solvent such as methyl ethyl ketone, propylene glycol methyl ether acetate, toluene, or a combination thereof. The coating method is not specifically limited, which can be blade coating, brush coating, roller coating, wire rod coating, spin-on coating, or screen printing on the basis of the application. The baking can be performed at a temperature of 80° C. to 120° C. for a period of 0.1 hours to 0.5 hours for removing the solvent.

A film prepared from the packaging material in some embodiments of the disclosure have low coefficient of thermal expansion, high glass transfer temperature, high toughness, and low stress, which is suitable to serve as a non-conductive paste in hot pressing for wafer level film package, flip chip film package, driving IC film package, and the like.

Below, exemplary embodiments will be described in detail so as to be easily realized by a person having ordinary knowledge in the art. The inventive concept may be embodied in various forms without being limited to the exemplary embodiments set forth herein. Descriptions of well-known parts are omitted for clarity.

EXAMPLES

Preparation Example 1 (Synthesis of Epoxy Silsesquioxane)

92.8 g of silsesquioxane precursor (DDSQ-SiH, commercially available from PNC Co.) and 14.9 g of allyl glycidyl ether (commercially available from Sigma Aldrich) were added to 350 mL of toluene, and then heated to 80° C. 0.8 mL of platinum catalyst (SIP6831.2LC, commercially available from Gelest) was then added to the toluene solution to perform hydrosilylation for about 24 hours. The reaction result was then cooled to room temperature (about 25° C.), and then filtered to collect the filtrate. The filtrate was then re-precipitated in pentane, and then filtered to collect the filtered cake. The filtered cake was dried to obtain epoxy silsesquioxane (DDSQ epoxy-1). The reaction is shown in FIG. 1.

The epoxy silsesquioxane (DDSQ epoxy-1) was analyzed by FTIR to obtain an IR spectrum (KBR, cm$^{-1}$): 910 cm$^{-1}$ (epoxy), 1130 cm$^{-1}$ (Si—O—Si stretching), 1490 cm$^{-1}$, and 1590 cm$^{-1}$ (benzene ring).

The epoxy silsesquioxane (DDSQ epoxy-1) was analyzed by NMR to obtain a $^1$H NMR spectrum (CDCl$_3$; δ, ppm): δ 7.0-8.0 ppm (aromatic protons), δ 3.5 ppm (O—CH$_2$-epoxy), δ 2.4 & 2.7 & 3.0 ppm (epoxy protons), δ 1.7 ppm (Si—CH$_2$—CH$_2$), δ 0.7 ppm (Si—CH$_2$—R), and δ 0.4 ppm (Si—CH$_3$).

Preparation Example 2 (Synthesis of Siloxane-Imide-Containing Benzoxazine Compound)

55 g of nadic anhydride (commercially available from Alfa Aeser) and 200 mL of toluene were evenly mixed and then heated to about 70° C. 0.4 mL of Pt-catalyst was then added to the mixture, and 112.6 g of hydride terminated polydimethylsiloxane (DMS-H03, commercially available from Gelest) was then added to and reacted with the mixture at about 70° C. for about 48 hours. The reaction result was then purified by active carbon adsorption, and then filtered to collect the filtrate (intermediate product 1).

Subsequently, 21.2 g of aminophenol (commercially available from Sigma Aldrich) was added to 66 g of intermediate product 1, and then stirred and reacted at ice bath for 6 hours. The reaction result was concentrated by vacuum to remove the solvent thereof, thereby obtaining intermediate product 2.

Figure 2:
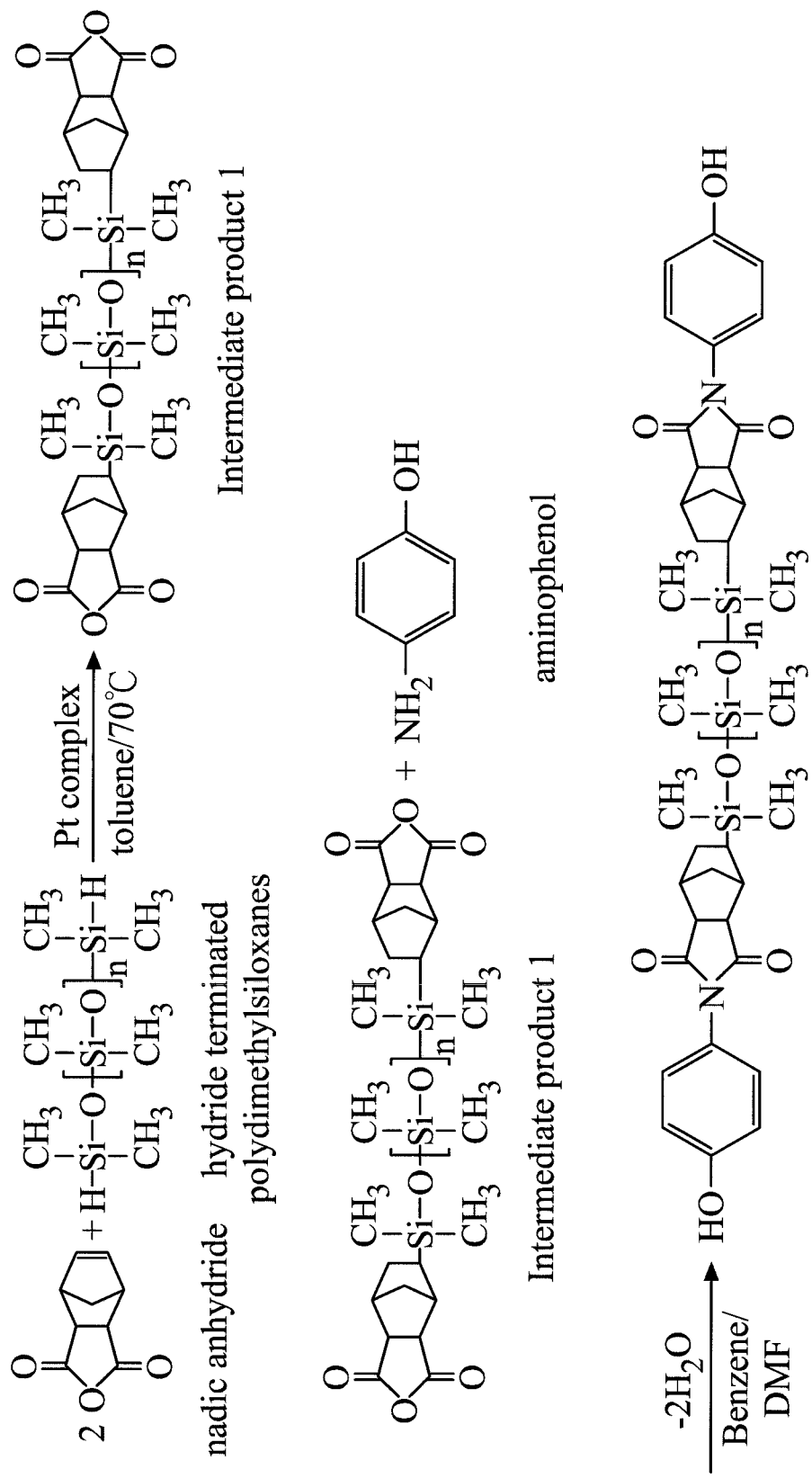
Figure 3:
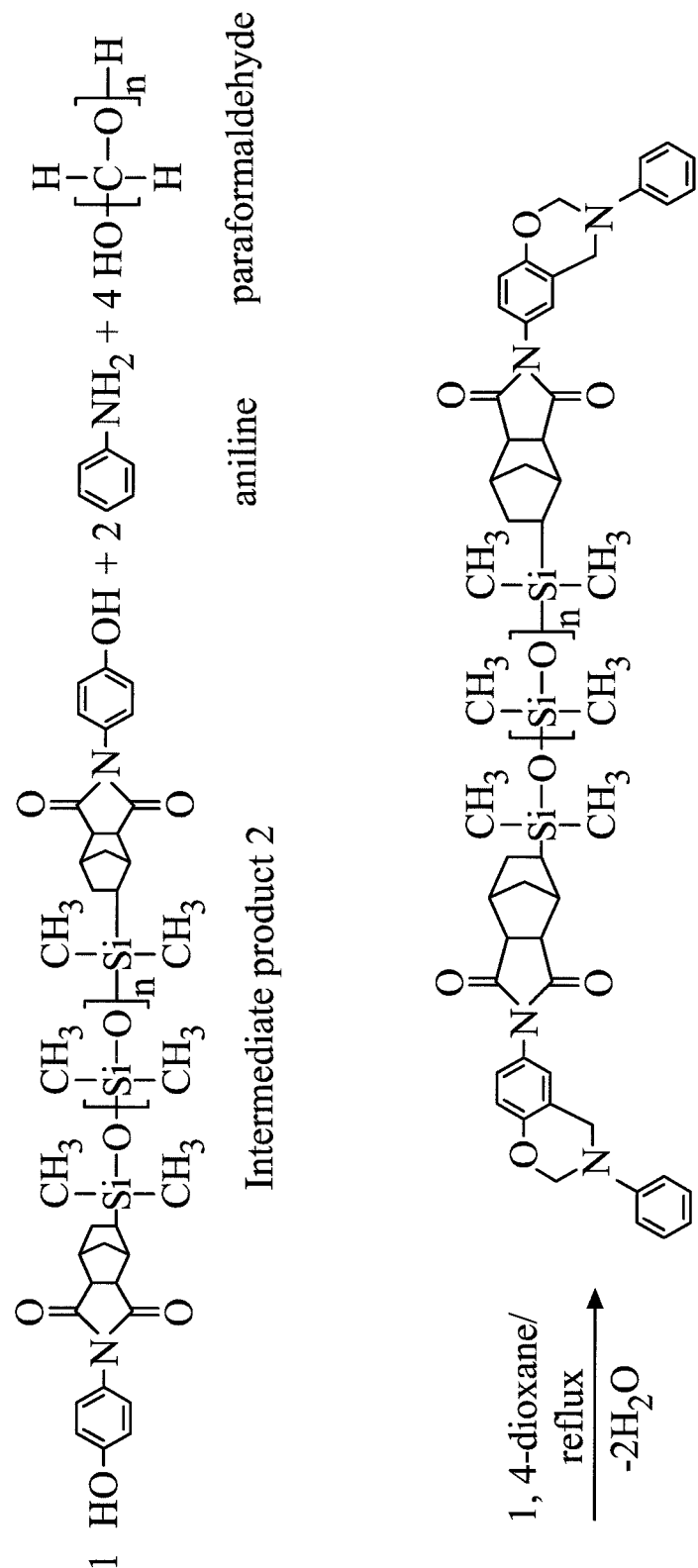

40 g of intermediate product 2 and 7.44 g of aniline (commercially available from Sigma Aldrich), 5 g of paraformaldehyde (commercially available from Sigma Aldrich), and 200 mL of 1,4-dioxane (commercially available from Sigma Aldrich) were mixed, then heated to about 115° C., and reacted at 115° C. for 20 hours. The reaction result was extracted with 0.5N NaOH solution (one time) and water (two times) to collect the organic phase. The organic phase was concentrated to obtain a siloxane-imide-containing benzoxazine compound (BZ-A6). The reactions are shown in FIGS. 2 and 3.

BZ-A6 was analyzed by FTIR to obtain an IR spectrum (KBR, cm$^{-1}$): 1256 cm$^{-1}$ (C—O—C stretching), 1178 cm$^{-1}$ (C—N—C stretching), 1307 cm$^{-1}$ (CH$_2$, wagging of oxazine), and 1502 cm$^{-1}$ (trisubstituted benzene ring).

BZ-A6 was analyzed by NMR to obtain a $^1$H NMR spectrum (CDCl$_3$; δ, ppm): δ 6.70-7.30 ppm (aromatic protons), δ 5.35 ppm (oxazine OCH$_2$N), δ 4.65 ppm (oxazine Ar—CH$_2$—N).

EXAMPLES

Example 1

20.3 g of bisphenol A epoxy resin mixture (commercially available from Mitsubishi Chemical, 828 (EEW=190) and 1004 (EEW=850) having a weight ratio of 4:1) and 11.1 g of the epoxy silsesquioxane (DDSQ epoxy-1, prepared in Preparation Example 1) were mechanically stirred and mixed at room temperature for 20 minutes. 18.4 g of silicon oxide powder (SFP-20M commercially available from DENKA, d$_{50}$=0.3 μm), 15 g of methyl ethyl ketone (MEK), and 15 g of propylene glycol methyl ether acetate (PGMEA, commercially available from ACROS) were then added into the above mixture, then mechanically stirred and mixed at room temperature for 30 minutes, and then dispersed by a three roller (EXAKT 80S).

Subsequently, 6.7 g of carboxyl terminated butadiene acrylonitrile (Nipol 1072, commercially available from BF GOODRICH) was then added to the dispersion, and then mechanically stirred and mixed at room temperature. 35.4 g of the siloxane-imide-containing benzoxazine compound (BZ-A6, prepared in Preparation Example 2) was then added to and mixed with the mixture, and 0.7 g of the sulfanilamide (SAA, commercially available from ACROS) was then added to and mixed with the mixture.

Subsequently, 3.6 g of triphenylphosphine (commercially available from ACROS), 2 g of 2-(methacryloyloxy) ethyl succinate (commercially available from Sigma Aldrich), and 0.3 g of fluorine-based polymer surfactant (FC-4332, commercially available from 3M) were added to and mixed with the mixture to obtain packaging material (1).

Example 2

11.4 g of bisphenol A epoxy resin mixture (commercially available from Mitsubishi Chemical, 828 (EEW=190) and 1004 (EEW=850) having a weight ratio of 4:1) and 24.9 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 31.9 g of the siloxane-imide-containing benzoxazine compound (BZ-A6) was then added to and mixed with the mixture, and 0.7 g of the SAA was then added to and mixed with the mixture.

Subsequently, 3.6 g of triphenylphosphine, 2 g of 2-(methacryloyloxy) ethyl succinate, and 0.3 g of fluorine-based polymer surfactant (FC-4332) were added to and mixed with the mixture to obtain packaging material (2).

Example 3

4.9 g of bisphenol A epoxy resin mixture (commercially available from Mitsubishi Chemical, 828 (EEW=190) and 1004 (EEW=850) having a weight ratio of 4:1) and 42.7 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 17.1 g of the siloxane-imide-containing benzoxazine compound (BZ-A6) was then added to and mixed with the mixture, and 0.7 g of the SAA was then added to and mixed with the mixture.

Subsequently, 3.6 g of triphenylphosphine, 2 g of 2-(methacryloyloxy) ethyl succinate, and 0.3 g of fluorine-based polymer surfactant (FC-4332) were added to and mixed with the mixture to obtain packaging material (3).

Example 4

14.4 g of bisphenol A epoxy resin mixture (commercially available from Mitsubishi Chemical, 828 (EEW=190) and 1004 (EEW=850) having a weight ratio of 4:1) and 31.4 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 16.1 g of the siloxane-imide-containing benzoxazine compound (BZ-A6) was then added to and mixed with the mixture, and 0.7 g of the SAA was then added to and mixed with the mixture.

Subsequently, 3.6 g of triphenylphosphine, 2 g of 2-(methacryloyloxy) ethyl succinate, and 0.3 g of fluorine-based polymer surfactant (FC-4332) were added to and mixed with the mixture to obtain packaging material (4).

Example 5

12.3 g of bisphenol A epoxy resin mixture (commercially available from Mitsubishi Chemical, 828 (EEW=190) and 1004 (EEW=850) having a weight ratio of 4:1) and 26.9 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 27.5 g of the siloxane-imide-containing benzoxazine compound (BZ-A6) was then added to and mixed with the mixture, and 0.7 g of the SAA was then added to and mixed with the mixture.

Subsequently, 3.6 g of triphenylphosphine, 2 g of 2-(methacryloyloxy) ethyl succinate, and 0.3 g of fluorine-based polymer surfactant (FC-4332) were added to and mixed with the mixture to obtain packaging material (5).

Example 6

10.7 g of bisphenol A epoxy resin mixture (commercially available from Mitsubishi Chemical, 828 (EEW=190) and 1004 (EEW=850) having a weight ratio of 4:1) and 23.2 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 34.5 g of the siloxane-imide-containing benzoxazine compound (BZ-A6) was then added to and mixed with the mixture, and 0.7 g of the SAA was then added to and mixed with the mixture.

Subsequently, 3.6 g of triphenylphosphine, 2 g of 2-(methacryloyloxy) ethyl succinate, and 0.3 g of fluorine-based polymer surfactant (FC-4332) were added to and mixed with the mixture to obtain packaging material (6).

Property tests and back-end tests of packaging materials (1) to (6) were performed, such as the film formability at B-stage/uniformity, the film transparency, the cutting test, the coefficient of thermal expansion (CTE), the initial contact resistance test, the contact resistance test after MSL3, and the contact resistance test after temperature (cooling/heating) cycle test (TCT), as described below. The properties and the test results of packaging materials (1) to (6) are tabulated in Table 1.

Film Formability at B-Stage/Uniformity Test

Packaging material (1) to (6) were blade coated onto a polyethylene terephthalate (PET) film with a thickness of about 100 μm, and then baked at a temperature of 90° C. for a period of 20 minutes to form a B-stage film. Thereafter, the film appearance was observed to check whether the broken bubbles were formed on the film surface.

The determination standard of this test is described below. The excellent film formability with the flat film surface free of any bubble is labeled as O. The excellent film formability with some bubbles formed on the film surface is labeled as Δ. The poor film formability with the cracked film is labeled as X.

The Film Transparency Test

The B-stage films were prepared as described above, and the transparency of the films were measured by a spectrophotometer commercially available from NIPPON DENSHOKU.

The determination standard of this test is described below. Transparency greater than 90% with a clear alignment at a light of 450 nm is labeled as O. Transparency of 70% to 90% with a fuzzy alignment at a light of 450 nm is labeled as Δ. Transparency of less than 70% without the ability to be aligned at a light of 450 nm is labeled as X.

Cutting Test

The B-stage films were prepared as described above, and then respectively adhered onto semiconductor wafers of 4 inches. The above wafers were respectively cut by a water blade NBC-ZH 127F-SE 27HCC of a cutting apparatus DFD-6361 (commercially available from Disco Corporation) with a spindle rotation rate of 25000 rpm and a cutting rate of 50 mm/s to obtain chips. The cutting locations of the chips (6.3 mm×6.3 mm) were observed by microscopy to check whether any cracking occurred.

The determination standard of this test is described below. No cracking means that the ability to sustain the cutting was good, and is labeled as O. The cracking means that the ability to sustain the cutting was poor, and is labeled as X.

Coefficient of Thermal Expansion (CTE)

The B-stage films were prepared as described above, then respectively transferred to copper foils at a transferring temperature of 80° C., then respectively curing at 180° C. for 2 hours, and then respectively heated to 210° C. and remained at 210° C. for 2 hours. Thereafter, the copper foils were removed by etching, and the CTE of the films were analyzed by thermal mechanical analysis (TMA) by TA Q400. The films for the TMA had a size of 10 m (length)×0.5 mm (width)×20 μm (thickness). The TMA was performed at 30° C. to 250° C. with a temperature increase rate of 10° C./min, and a force of 0.05N was applied to the film during the TMA to analyze the CTE of the films.

Initial Contact Resistance Test

The B-stage films were prepared as described above, and then respectively disposed between semiconductor chips and a carrier substrate. Each of the chips had a size of 6.3 mm (length)×6.3 mm (width)×0.3 mm (thickness) and lead-free solder bumps. The above structures were respectively hot pressed by a temperature of 260° C. and a pressure of 10 kg/chip for 15 seconds to obtain chip package devices. Thereafter, the resistances of chip package devices were measured by a precision multimeter. The number of the chips in the device to be analyzed was 10, and the analysis results were recorded as failed chips/total chips (XX/10).

The determination standard of this test is described below. The resistance of the chip being less than 1Ω means that the chip was electrically conducted. The resistance of the chip being greater than 100Ω means that the chip failed. The recorded value, such as XX/10, refers to the number of failed chips per 10 chips.

The Contact Resistance Test after MSL 3

The chip package devices were prepared as described above, then put into a constant temperature and humidity machine (KBR115, commercially available from BINDER), and then stored at a temperature of 30° C. and a relative humidity of 60% for 192 hours for the MSL3 reliability test. Subsequently, the chip package devices were respectively put into a reflow oven (commercially available from Yuanxing Technology Co., Ltd) to perform IR reflow at 260° C. for 10 seconds 3 times. Thereafter, the resistances of chip package devices were measured by the precision multimeter.

The determination standard of this test is described below. The resistance of the chip being less than 1Ω means that the chip was electrically conducted. The resistance of the chip being greater than 100Ω means that the chip failed. The recorded value, such as XX/10, refers to the number of failed chips per 10 chips.

The Contact Resistance Test after the TCT

The chip package devices were prepared as described above, and then put into a temperature (cooling/heating) cycle test (TCT) machine (ESPEC TSE-11-A) to perform TCT as below: stayed at −40° C. for 15 minutes, then heated to 120° C. in 5 minutes, then stayed at 120° C. for 15 minutes, and then cooled to −40° C. The above cycle was repeated 1000 times. Thereafter, the resistances of chip package devices were measured by the precision multimeter.

The determination standard of this test is described below. The resistance of the chip being less than 1Ω means that the chip was electrically conducted. The resistance of the chip being greater than 100Ω means that the chip failed. The recorded value, such as XX/10, refers to the number of failed chips per 10 chips.

TABLE

| | Example 1 | Example 2 | Example 3 | Example 4 | Example 5 | Example 6 |
|---|---|---|---|---|---|---|
| Film formability at B-stage/uniformity test | O | O | O | O | O | O |
| Film Transparency test | O | O | O | O | O | O |
| Cutting test | O | O | O | O | O | O |
| CTE | 58.2 | 53.2 | 46.7 | 50.2 | 54.9 | 57.8 |
| Initial contact resistance test | 0/10 | 0/10 | 0/10 | 0/10 | 0/10 | 0/10 |
| Contact resistance test after MSL3 | 0/10 | 0/10 | 0/10 | 0/10 | 0/10 | 0/10 |
| Contact resistance test after TCT | 0/10 | 0/10 | 0/10 | 0/10 | 0/10 | 0/10 |

Comparative Example 1

23 g of bisphenol A epoxy resin mixture (commercially available from Mitsubishi Chemical, 828 (EEW=190) and 1004 (EEW=850) having a weight ratio of 4:1) and 5 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 32 g of the siloxane-imide-containing benzoxazine compound (BZ-A6) was then added to and mixed with the mixture, and 0.7 g of the SAA was then added to and mixed with the mixture.

Subsequently, 3.6 g of triphenylphine, 2 g of 2-(methacryloyloxy) ethyl succinate, and 0.3 g of fluorine-based polymer surfactant (FC-4332) were added to and mixed with the mixture to obtain packaging material (7).

Comparative Example 2

4.5 g of bisphenol A epoxy resin mixture (commercially available from Mitsubishi Chemical, 828 (EEW=190) and 1004 (EEW=850) having a weight ratio of 4:1) and 50 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 23.1 g of the siloxane-imide-containing benzoxazine compound (BZ-A6) was then added to and mixed with the mixture, and 0.7 g of the SAA was then added to and mixed with the mixture.

Subsequently, 3.6 g of triphenylphine, 2 g of 2-(methacryloyloxy) ethyl succinate, and 0.3 g of fluorine-based polymer surfactant (FC-4332) were added to and mixed with the mixture to obtain packaging material (8).

Comparative Example 3

23.5 g of bisphenol A epoxy resin mixture (commercially available from Mitsubishi Chemical, 828 (EEW=190) and 1004 (EEW=850) having a weight ratio of 4:1) and 32.5 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 10 g of the siloxane-imide-containing benzoxazine compound (BZ-A6) was then added to and mixed with the mixture, and 0.7 g of the SAA was then added to and mixed with the mixture.

Subsequently, 3.6 g of triphenylphine, 2 g of 2-(methacryloyloxy) ethyl succinate, and 0.3 g of fluorine-based polymer surfactant (FC-4332) were added to and mixed with the mixture to obtain packaging material (9).

Comparative Example 4

14.3 g of bisphenol A epoxy resin mixture (commercially available from Mitsubishi Chemical, 828 (EEW=190) and 1004 (EEW=850) having a weight ratio of 4:1) and 11.8 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 40 g of the siloxane-imide-containing benzoxazine compound (BZ-A6) was then added to and mixed with the mixture, and 0.7 g of the SAA was then added to and mixed with the mixture.

Subsequently, 3.6 g of triphenylphine, 2 g of 2-(methacryloyloxy) ethyl succinate, and 0.3 g of fluorine-based polymer surfactant (FC-4332) were added to and mixed with the mixture to obtain packaging material (10).

Comparative Example 5

14.7 g of bisphenol A epoxy resin mixture (commercially available from Mitsubishi Chemical, 828 (EEW=190) and 1004 (EEW=850) having a weight ratio of 4:1) and 31.9 g of the epoxy silsesquioxane (DDSQ epoxy-1) were mechanically stirred and mixed at room temperature for 20 minutes. 18.4 g of silicon oxide powder (SFP-20M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 14.3 g of the benzoxazine (BZ-a, commercially available from Chemieliva Pharmaceutical Co., Ltd.) was then added to and mixed with the mixture, and 0.7 g of the SAA was then added to and mixed with the mixture.

Subsequently, 3.6 g of triphenylphine, 2 g of 2-(methacryloyloxy) ethyl succinate, and 0.3 g of fluorine-based polymer surfactant (FC-4332) were added to and mixed with the mixture to obtain packaging material (11).

Comparative Example 6

11.4 g of bisphenol A epoxy resin mixture (commercially available from Mitsubishi Chemical, 828 (EEW=190) and 1004 (EEW=850) having a weight ratio of 4:1), 20.9 g of silsesquioxane precursor (DDSQ-SiH, commercially available from PNC Co.), and 4 g of allyl glycidyl ether (commercially available from Sigma Aldrich) were mechanically stirred and mixed at room temperature for 20 minutes. 18.4 g of silicon oxide powder (SFP-20 M), 15 g of MEK, and 15 g of PGMEA were then added into the above mixture, then mechanically stirred and mixed at room temperature for 30 minutes, and then dispersed by the three roller (EXAKT 80S).

Subsequently, 6.7 g of carboxyl terminated butadiene acrylonitrile (Nipol 1072) was then added to the dispersion, and then mechanically stirred and mixed at room temperature. 31.9 g of the siloxane-imide-containing benzoxazine compound (BZ-A6) was then added to and mixed with the mixture, and 0.7 g of the SAA was then added to and mixed with the mixture.

Subsequently, 3.6 g of triphenylphine, 2 g of 2-(methacryloyloxy) ethyl succinate, and 0.3 g of fluorine-based polymer surfactant (FC-4332) were added to and mixed with the mixture to obtain packaging material (12).

The property tests and the back-end tests of packaging materials (7) to (12) were performed, such as the film formability at B-stage/uniformity, the film transparency, the cutting test, the CTE, the initial contact resistance test, the contact resistance test after MSL3, and the contact resistance test after the TCT, as described above. The properties and the test results of packaging materials (7) to (12) are tabulated in Table 2.

TABLE 2

| | Comparative Example 1 | Comparative Example 2 | Comparative Example 3 | Comparative Example 4 | Comparative Example 5 | Comparative Example 6 |
|---|---|---|---|---|---|---|
| Film formability at B-stage/uniformity test | ○ | Δ | Δ | ○ | X | X |
| Film Transparency | ○ | ○ | ○ | Δ | — | — |
| Cutting test | X | X | X | X | — | — |
| CTE | 64.5 | 45.4 | 50.1 | 72.8 | — | — |
| Initial contact resistance test | 2/10 | 2/10 | 2/10 | 2/10 | — | — |
| Contact resistance test after MSL3 | 5/10 | 4/10 | 5/10 | 4/10 | — | — |
| Contact resistance test after TCT | 5/10 | 4/10 | 5/10 | 4/10 | — | — |

As shown in Tables 1 and 2, the packaging materials in the disclosure include the epoxy silsesquioxane and siloxane-imide-containing benzoxazine compound, such that the packaging materials had excellent film formability, and the semiconductor chip packaged in the packaging materials had excellent electrical conductivity. However, too much or too little the epoxy silsesquioxane (e.g. Comparative Example 1 or 2) or too much or too little the siloxane-imide-containing benzoxazine compound (e.g. Comparative Example 3 or 4) could affect the film formability at B-stage/uniformity, film transparency, or cutting resistance. In Comparative Examples 1 to 4, the films of the packaging materials were adhered onto the chips and then cut, and fragments were observed by the microscopy. As shown in the results of back-end test, the chips packaged by packaging materials (7) to (10) had high failure ratios. In addition, the commercially available benzoxazine compound was used in Comparative Example 5, which lacked soft segments of siloxane (Si—O—Si). As such, the film formability of packaging material (11) at B-stage was poor. On the other hand, when the silsesquioxane precursor and the epoxy compound were respectively added to and mixed with the mixture in Comparative Example 6, rather than being pre-reacted to prepare the epoxy silsesquioxane, packaging material (12) could not form a film.

It will be apparent to those skilled in the art that various modifications and variations can be made to the disclosed methods and materials. It is intended that the specification and examples be considered as exemplary only, with the true scope of the disclosure being indicated by the following claims and their equivalents.

What is claimed is:

1. A packaging material, comprising:
   (a) epoxy silsesquioxane;
   (b) epoxy resin; and
   (c) siloxane-imide-containing benzoxazine compound,
   wherein (a) epoxy silsesquioxane and (b) epoxy resin have a weight ratio of 0.3:1 to 10:1;
   wherein the total weight of (a) epoxy silsesquioxane and (b) epoxy resin and the weight of (c) siloxane-imide-containing benzoxazine compound have a ratio of 100:20 to 100:150,
   wherein (a) epoxy silsesquioxane has a chemical structure as shown in Formula 1 or Formula 2:

$(R^1SiO_{3/2})_{n1}(R^2SiO_{2/2})_{n2}$  (Formula 1)

$(R^3SiO_{3/2})_{n3}(R^4SiO_{3/2})_{n4}$  (Formula 2)

wherein each of $R^1$ and $R^3$ is independently $C_1$-$C_{10}$ alkyl group or aromatic group;
   each of $R^2$ and $R^4$ is independently epoxy cyclohexylethyl group or epoxy propyl ether allyl group;
   n1+n2 is an integer of 4 to 12, and n2 is 2, 4, or 6; and
   n3+n4 is an integer of 4 to 12, and n4 is 2, 3, 4, 6, 8, 10, or 12.

2. The packaging material as claimed in claim 1, wherein (c) siloxane-imide-containing benzoxazine compound has a chemical structure as shown in Formula 3:

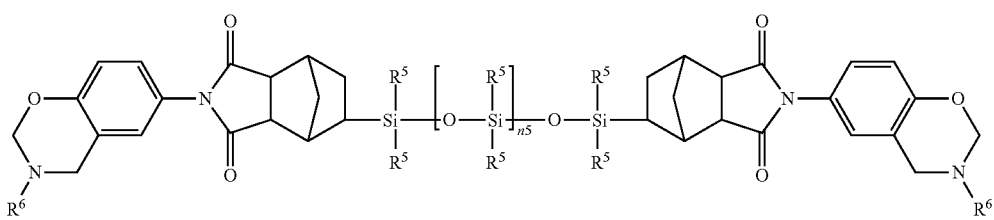

(Formula 3)

wherein each of $R^5$ is independently $C_{1-10}$ alkyl group or aromatic group; each of $R^6$ is independently $C_{1-10}$ alkyl group of aromatic group; and
n5 is 1 to 18.

3. The packaging material as claimed in claim 1, wherein (b) epoxy resin includes bisphenol A epoxy resin, bisphenol F epoxy resin, bisphenol S epoxy resin, polyacrylic epoxy resin, cycloaliphatic epoxy resin, glycerine epoxy resin, phenolic epoxy resin, phenylene oxide epoxy resin, or a combination thereof.

4. The packaging material as claimed in claim 1, further comprising (d) amine curing agent, wherein the total weight of (a) epoxy silsesquioxane and (b) epoxy resin and the weight of (d) amine curing agent have a ratio of 100:1 to 100:2.5.

5. The packaging material as claimed in claim 1, further comprising (e) inorganic powder, wherein the total weight of (a) epoxy silsesquioxane and (b) epoxy resin and the weight of (e) inorganic powder have a ratio of 100:30 to 100:60, (e)

inorganic powder comprises $SiO_2$, $ZnO_2$, $TiO_2$, $Al_2O_3$, $CaCO_3$, or a combination thereof, and (e) inorganic powder has a diameter of 0.1 μm to 1 μm.

6. The packaging material as claimed in claim 1, further comprising (f) toughness enhancer, wherein the total weight of (a) epoxy silsesquioxane and (b) epoxy resin and the weight of (f) toughness enhancer have a ratio of 100:12 to 100:25, and (f) toughness enhancer comprises butadiene acrylonitrile rubber, carboxyl terminated butadiene acrylonitrile rubber, polysulfide rubber, epoxy terminated butadiene acrylonitrile rubber, or a combination thereof.

7. The packaging material as claimed in claim 1, further comprising (g) reaction promoter, wherein the total weight of (a) epoxy silsesquioxane and (b) epoxy resin and the weight of (g) reaction promoter have a ratio of 100:7 to 100:12, and (g) reaction promoter comprises imidazole compound.

8. The packaging material as claimed in claim 1, further comprising (h) soldering agent, wherein the total weight of (a) epoxy silsesquioxane and (b) epoxy resin and the weight of (h) soldering agent have a ratio of 100:4 to 100:7, and (h) soldering agent comprises organic acid compound, quinoline compound, or a combination thereof.

9. The packaging material as claimed in claim 1, further comprising (i) surfactant, the total weight of (a) epoxy silsesquioxane and (b) epoxy resin and the weight of (i) surfactant have a ratio of 100:0.5 to 100:1, and (i) surfactant comprises fluorine-based surfactant, silane-based surfactant, or a combination thereof.

10. A film, being formed by coating and baking the packaging material as claimed in claim 1.

* * * * *